(12) United States Patent
Katsurayama et al.

(10) Patent No.: US 8,169,090 B2
(45) Date of Patent: May 1, 2012

(54) ENCAPSULATING RESIN COMPOSITION FOR PREAPPLICATION, SEMICONDUCTOR DEVICE MADE WITH THE SAME, AND PROCESS FOR PRODUCING THE SAME

(75) Inventors: Satoru Katsurayama, Tokyo (JP); Yushi Sakamoto, Tokyo (JP); Masaya Koda, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 766 days.

(21) Appl. No.: 11/915,806

(22) PCT Filed: May 30, 2006

(86) PCT No.: PCT/JP2006/310722
§ 371 (c)(1),
(2), (4) Date: Jan. 27, 2009

(87) PCT Pub. No.: WO2006/129630
PCT Pub. Date: Dec. 7, 2006

(65) Prior Publication Data
US 2009/0166897 A1 Jul. 2, 2009

(30) Foreign Application Priority Data

| | | |
|---|---|---|
| May 31, 2005 | (JP) | 2005-159900 |
| May 31, 2005 | (JP) | 2005-159921 |
| Sep. 26, 2005 | (JP) | 2005-278417 |
| Feb. 27, 2006 | (JP) | 2006-050174 |

(51) Int. Cl.
*H01L 23/29* (2006.01)

(52) U.S. Cl. ............... 257/793; 257/E23.119; 257/787; 257/790; 438/124; 438/126

(58) Field of Classification Search ........... 257/E21.599, 257/E23.119, 793, 787, 788, 789, 790, 794; 438/113, 124, 126, 127; 524/317, 612; 525/523
See application file for complete search history.

(56) References Cited

U.S. PATENT DOCUMENTS 4,609,427 A * 9/1986 Inamoto et al. ............... 216/27
4,719,255 A * 1/1988 Yoshizumi et al. ........... 523/436
(Continued)

FOREIGN PATENT DOCUMENTS
JP 2003-212964 7/2003
(Continued)

OTHER PUBLICATIONS
Chinese Office Action issued on Jan. 29, 2010 for Chinese Application No. 200680025514.6 w/ English translation.

*Primary Examiner* — Chris Chu
(74) *Attorney, Agent, or Firm* — Smith, Gambrell & Russell, LLP

(57) ABSTRACT

An encapsulation resin composition for preapplication, comprising (a) an epoxy resin, and (b) a curing agent having flux activity, wherein the tack after B-staging is at least 0 gf/5 mm$\phi$ and at most 5 gf/5 mm$\phi$, and the melt viscosity at 130° C. is at least 0.01 Pa·s and at most 1.0 Pa·s; a preapplied encapsulated component and semiconductor device using the composition, and a process of fabrication thereof. The resin composition is less susceptible to air entrapment during provisional placement of semiconductor chips, and excels in workability and reliability.

25 Claims, 1 Drawing Sheet

State with particles melted (after curing)

U.S. PATENT DOCUMENTS

| | | | |
|---|---|---|---|
| 5,167,674 A * | 12/1992 | Ika | 51/298 |
| 5,248,757 A * | 9/1993 | Hefner et al. | 528/322 |
| 5,300,594 A * | 4/1994 | Durvasula et al. | 525/502 |
| 5,387,657 A * | 2/1995 | Hefner et al. | 525/523 |
| 5,442,039 A * | 8/1995 | Hefner et al. | 528/422 |
| 5,460,860 A * | 10/1995 | Hefner et al. | 428/1.53 |
| 5,470,946 A * | 11/1995 | Hefner et al. | 528/422 |
| 5,612,479 A * | 3/1997 | Hefner et al. | 544/88 |
| 5,637,669 A * | 6/1997 | Hefner et al. | 528/97 |
| 6,294,259 B1 * | 9/2001 | Anderson et al. | 428/413 |
| 6,911,606 B2 * | 6/2005 | Suda | 174/259 |
| 6,919,420 B2 * | 7/2005 | Buchwalter et al. | 528/230 |
| 7,109,061 B2 * | 9/2006 | Crane et al. | 438/118 |

FOREIGN PATENT DOCUMENTS

| | | |
|---|---|---|
| JP | 2003-243449 | 8/2003 |
| JP | 2004-174574 | 6/2004 |

\* cited by examiner

[Fig. 1]
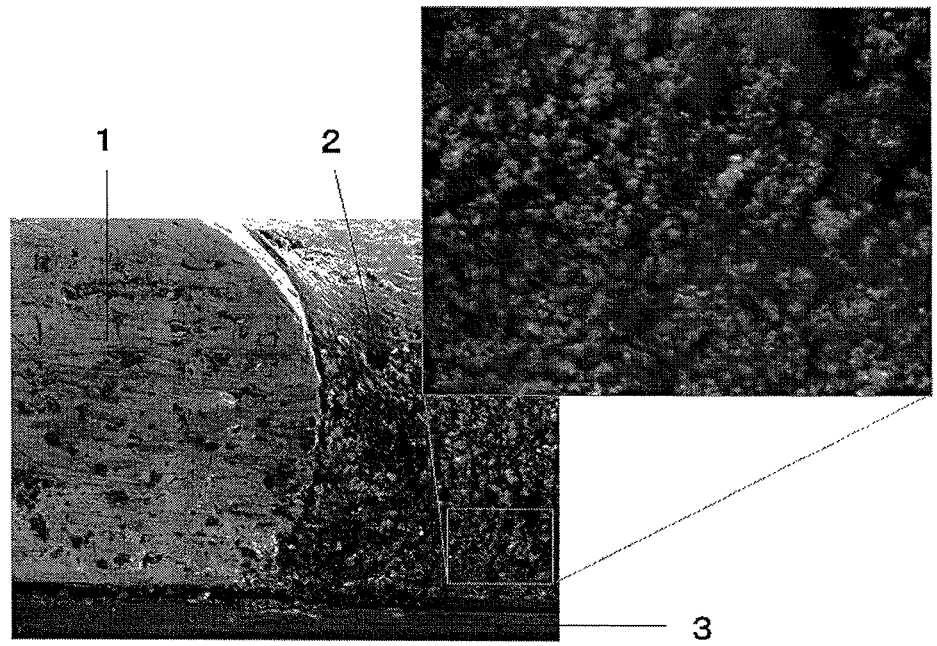
FIG 1 State with curing agent dispersed (before curing)
[Fig. 2]
FIG 2 State with particles melted (after curing)
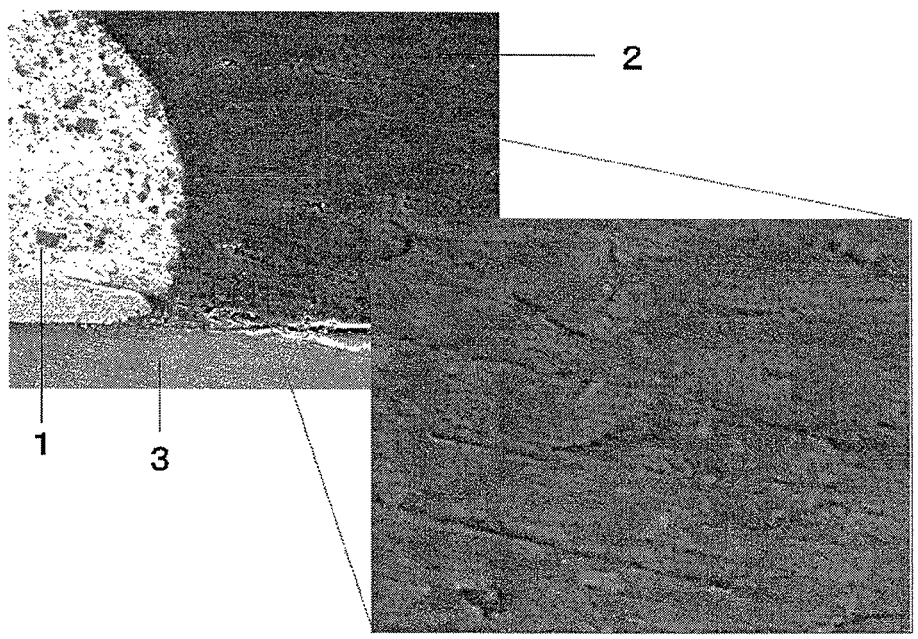

ENCAPSULATING RESIN COMPOSITION FOR PREAPPLICATION, SEMICONDUCTOR DEVICE MADE WITH THE SAME, AND PROCESS FOR PRODUCING THE SAME

PRIORITY

The present application claims priority under Article 4 of the Paris Convention based on Japanese Patent Application No. 2005-278417 filed Sep. 26, 2005, on Japanese Patent Application No. 2006-050174 filed Feb. 27, 2006 which claims priority under Article 41 of the Patent Act of Japan based on said Japanese Patent Application No. 2005-278417, on Japanese Patent Application No. 2005-159921 filed May 31, 2005 and on Japanese Patent Application No. 2005-159900, the disclosures of all of which are incorporated into the present specification by reference.

TECHNICAL FIELD

The present invention relates to an encapsulating resin composition for preapplication, a preapplied encapsulated component and semiconductor device using the same, and a process for producing the same.

BACKGROUND

Recent years have seen remarkable technological advances in the lightening and downsizing of semiconductor packages, and many package structures have been proposed and brought to market. Particularly noteworthy are area-mounted formats in which a semiconductor package is bonded to the circuit board (motherboard) by means of bump electrodes of solder or the like, instead of by conventional lead frame bonding.

In particular, the flip-chip format in which bump electrodes are directly provided on the circuit surface of a semiconductor chip is one method of minimizing packages. Flip-chip mounting, in the case of solder electrodes, involves treating the surface of the solder electrodes with flux to remove oxide layers, followed by bonding by reflow or the like. As a result, flux can remain in the areas around the solder electrodes and circuit board and cause problems in the form of impurities. Therefore, encapsulation is performed after a cleaning treatment to remove the flux. The reason for this is that the semiconductor package is directly bonded to the circuit board (motherboard) by bump electrodes, so when reliability tests such as temperature cycling tests are performed, differences in the coefficient of thermal expansion between the chip and the circuit board can cause electrical defects in the electrode junction portions.

The above-described semiconductor package encapsulation involves applying an encapsulating resin on one side or multi-sides of the chip and allowing the resin to seep into the gaps between the circuit board and the chip by capillary action. However, since this method requires a flux treatment and cleaning to be performed, the process can become very long, and the environmental control must be enhanced to deal with the problem of disposing of the waste fluid from cleaning. Furthermore, the encapsulation can take a long time due to the fact that it relies on capillary action, thus presenting problems for the productivity.

Therefore, a method of applying resin directly to a circuit board, mounting a chip having solder electrodes directly thereon, and performing solder bonding and resin encapsulation simultaneously has been proposed (see U.S. Pat. No. 5,128,746). This process is characterized by addition of an ingredient having flux action to a resin composition comprising a thermosetting resin and a curing agent for bonding the solder to the circuit board.

More recent proposals have involved preapplying an underfill to the semiconductor chip being carried by a chip carrier and B-staging to eliminate even the underfill applying step during mounting, and preapplied non-flow underfill materials with the additional advantage of providing users in the mounting process with semiconductor chips with underfill.

The aforementioned preapplied encapsulation processes have used only epoxy resins which are solid at room temperature as the thermosetting resin (see U.S. Pat. No. 5,128,746 and JP 2003-212964A).

Additionally, when applying the underfill material to the semiconductor chip in the aforementioned preapplied encapsulation processes, a solvent is added to the underfill material to form a varnish which is then applied and dried. Conventionally, varnishes using a single solvent have been used, these varnishes being good solvents for solid epoxy resins, and being poor solvents for curing agent having flux action (see JP 2003-212964).

However, the conventional art described in the above publications has room for improvement in connection with the following points.

First, preapplied encapsulating resin compositions using only a solid epoxy resin can cause problems such as air entrapment when provisionally placing a semiconductor chip on a circuit board, and this can easily result in voids in the semiconductor package, thus reducing the reliability of the package.

Therefore, one might contemplate using an epoxy resin that is liquid at room temperature to reduce the melt viscosity, but in that case, there can be tack after B-staging, and this can reduce the productivity of the dicing process.

Second, solid epoxy resins often have high crystallinity, and when encapsulating resin compositions containing these are applied to wafers and B-staged, they tend to become brittle and therefore susceptible to damage. For example, when the wafers are singulated by dicing, the blades can chip the B-staged encapsulating resin composition.

Third, while the singulated semiconductor chips described above are bonded to the substrate by thermocompression in the next step, the brittleness of the B-staged encapsulating resin composition can cause damage while handling the semiconductor chip before this second step is reached.

Fourth, since solvents which have good solubility for solid epoxy resins and poor solubility for curing agents having flux action generally have high boiling points, a drying temperature and drying time is needed in order to satisfactorily remove the solvent when applying the underfill material to the semiconductor chip. As a result, a problem arises in that a reaction between the epoxy resin and the curing agent progresses to some degree while the solvent is drying. Additionally, reactions between the epoxy resin and curing agent can affect the subsequent flux activity or remelting of the resin when bonding to the semiconductor chip, or reduce the pot life after B-staging.

Fifth, an adequate time is required to achieve satisfactory solvent removal and drying, thus prolonging the work time for the B-staging process.

Therefore, means for at least partially resolving the problems of the above-described background art have been sought. The means should offer a preapplied encapsulating resin composition in which there is little or no air entrapment. Additionally, the means should offer a preapplied encapsulating resin composition excelling in productivity and reliability. Furthermore, the means should offer a preapplied encapsulating resin composition that is not likely to be damaged by any process.

Additionally, the means should offer a liquid encapsulating resin composition that improves the solvent removal efficiency when the underfill material is being dried after application to the semiconductor chip, shortens the drying time and achieves a long pot life and maintains flux properties for a long time due to shortening of the heating time.

Furthermore, the above means should offer a preapplied encapsulated component and semiconductor device produced using the above-mentioned encapsulating resin for preapplication, and a method of producing the same.

BRIEF DESCRIPTION OF THE DRAWINGS

FIG. 1 is a SEM photograph of a cross section after B-staging.

FIG. 2 is a SEM photograph after B-staging followed by curing.

EXPLANATION OF REFERENCE NUMBERS 1 bump
2 encapsulating resin composition for preapplication
3 semiconductor chip

MODES FOR CARRYING OUT THE INVENTION

According to one embodiment, the present invention offers a composition, particularly an encapsulation resin composition for preapplication, comprising (a) an epoxy resin, and (b) a curing agent having flux activity, wherein the tack after B-staging is at least 0 gf/5 mmφ and at most 5 gf/5 mmφ, and the melt viscosity at 130° C. is at least 0.01 Pa·s and at most 1.0 Pa·s.

By suppressing the tack after B-staging, it is possible to improve the handling of singulated semiconductor chip. Furthermore, by suppressing the melt viscosity at 130° C., it is possible to reduce voids inside the semiconductor packages due by reducing air entrapment when provisionally placing singulated semiconductor chips onto a circuit board, thus improving the productivity by improving the fillet formability. As a result, an encapsulation resin composition for pre-application with little air entrapment when provisionally placing the semiconductor chip and excelling in workability and reliability is obtained.

According to one embodiment, an encapsulation resin composition for preapplication has a Tg after curing of at least 80° C. and at most 150° C.

Additionally, in one embodiment, a solvent (c) containing a first solvent that has good solubility for the aforementioned epoxy resin (a) and has poor solubility for the aforementioned curing agent (b) is further added, this solvent (c) being advantageously added in an amount of 10-70 wt % with respect to the aforementioned epoxy resin (a).

An example of the solvent is an ethyl acetate type solvent. By using such a solvent (c), the epoxy resin (a) can be adequately dissolved while dispersing the curing agent (b) having flux activity in the resin composition in solid form, thereby suppressing a curing reaction from occurring when applying the encapsulation resin composition to the semiconductor chip and B-staging. As a result, the resin composition melts also when the semiconductor chip and substrate are being bonded, thus stabilizing the melt state and achieving satisfactory flux activity.

Furthermore, while the aforementioned solvent (c) may contain only said first solvent as a solvent, it may further contain a second solvent having a lower boiling point than the aforementioned first solvent. By using a mixture of two solvents, it is possible to increase the volatility of the solvent and cause the solvent to evaporate at a temperature at which the epoxy resin and curing agent having flux activity have not overly reacted, thereby reducing voids during thermocompression bonding.

Additionally, by raising the solvent removal efficiency at the time of solvent drying, the time required for the drying process can also be reduced.

In that case, the solvent volatility can be particularly raised by making the boiling point difference between the first solvent and the second solvent, for example, 20° C. or more. Additionally, the second solvent may also have good solubility for the aforementioned epoxy resin and poor solubility for the aforementioned curing agent, and may, for example, be an ethyl acetate type solvent.

In a further embodiment, the epoxy resin (a) contains a condensed-ring aromatic compound having at least two epoxy groups in each molecule, the condensed-ring aromatic compound advantageously having a molecular weight of 1000 or less, for example, a naphthalene compound. In another embodiment, the epoxy resin comprises a biphenyl compound having at least two epoxy groups in each molecule, the biphenyl compound advantageously having a molecular weight of 1000 or less.

In yet a further embodiment, the epoxy resin (a) comprises an epoxy resin which is liquid at 25° C. and contains at least two epoxy groups in each molecule, and an epoxy resin which is solid at 25° C. and contains at least two epoxy groups in each molecule. Thus, by using an epoxy resin that is liquid at 25° C., it is possible to improve the flexibility during B-staging, making it less susceptible to damage such as the resin being stripped off even when applying the encapsulation resin composition to the wafer and B-staging.

In this case, the proportion of the solid epoxy resin with respect to the total weight of the aforementioned liquid epoxy resin and the aforementioned solid epoxy resin is advantageously 0.5-0.95. In a further embodiment, it is advantageously 0.6-0.95. Additionally, the aforementioned liquid epoxy resin is preferably chosen from the group consisting of bisphenol A diglycidyl ether type epoxy, bisphenol F diglycidyl ether type epoxy, bisphenol S diglycidyl ether type epoxy, o-allylbisphenol A type diglycidyl ether, 3,3',5,5'-tetramethyl-4,4'-dihydroxybiphenyldiglycidyl ether type epoxy, 4,4'-dihydroxybiphenyldiglycidyl ether type epoxy, 1,6-dihydroxybiphenyldiglycidyl ether type epoxy, phenol novolac type epoxy, brominated cresol novolac type epoxy, bisphenol D diglycidyl ether type epoxy, glycidyl ethers of 1,6-naphthalene diol, triglycidyl ethers of aminophenols, and monoepoxy compounds having one epoxy group in the molecule. Additionally, the aforementioned solid epoxy resin may be chosen from among the group consisting of phenol novolac type epoxy resin, cresol novolac type epoxy resin, cresol naphthol type epoxy resin, biphenyl type epoxy resin, biphenyl aralkyl type epoxy resin and naphthalene skeleton type epoxy resin.

In another embodiment, the aforementioned curing agent is advantageously a curing agent having at least two phenolic hydroxyl groups in each molecule and at least one carboxyl group directly bound to an aromatic in each molecule, the curing agent being added in an amount, for example, of 10-70 wt % with respect to the aforementioned epoxy resin.

In a further embodiment, the encapsulation resin composition for preapplication according to the present invention may further comprise a liquid stress reducing agent and/or a reactivity diluent. This is because, as described below, the stress reducing agent and the reactivity diluent can contribute to reduction of the melt viscosity of the encapsulation resin composition for preapplication.

In another embodiment, the present invention offers a pre-applied encapsulated component comprising a wafer and an encapsulation resin composition applied to the substrate bonding surface of the wafer, wherein the encapsulation resin composition is an encapsulation resin composition according to the present invention as described above. It is advantageous for the curing agent having flux activity to be dispersed as an undissolved part in the encapsulation resin composition for preapplication, and by using a preapplied encapsulated component with such a structure, the curing agent is mostly activated during bonding of the semiconductor chip and the substrate.

In a further embodiment, the present invention offers a semiconductor device encapsulated by an encapsulation resin composition for preapplication according to the present invention described above.

In yet another embodiment, the present invention offers a semiconductor device fabricated by steps of applying an encapsulation resin composition for preapplication according to the present invention as described above to a wafer, B-staging the encapsulation resin composition for preapplication after application to the wafer, dicing the wafer to singulate into semiconductor chips, and thermocompression bonding a substrate and the surface of a singulated semiconductor chip to which the encapsulation resin composition for preapplication has been applied.

In yet a further embodiment, the present invention offers a process for fabrication of a semiconductor device comprising a step of applying an encapsulation resin composition for preapplication according to the present invention as described above to a wafer, a step of B-staging the encapsulation resin composition for preapplication after application to the wafer, a step of dicing the wafer to singulate into semiconductor chips, and a step of thermocompression bonding a substrate and the surface of a singulated semiconductor chip to which the encapsulation resin composition for preapplication has been applied.

Those skilled in the art will recognize that still further embodiments are possible when considering the disclosure of the present specification. For example, the following embodiments are also included within the scope of the disclosure of the present specification.

1) An encapsulation resin composition for preapplication comprising an epoxy resin, a curing agent having flux activity, a first solvent and a second solvent, wherein the first solvent has good solubility for the epoxy resin and poor solubility for the curing agent, and the second solvent has a lower boiling point than the first solvent.
2) An encapsulation resin composition for preapplication comprising an epoxy resin which is liquid at 25° C. and contains at least two epoxy groups in each molecule, an epoxy resin which is solid at 25° C. and contains at least two epoxy groups in each molecule, and an curing agent having flux activity.
3) An encapsulation resin composition for preapplication comprising an epoxy rein, a curing agent having flux activity and a solvent, optionally further comprising a liquid stress reducing agent and/or a reactivity diluent, wherein the amount and/or type of one or more among the epoxy resin, the curing agent, the solvent, the stress reducing agent and the reactivity diluent are adjusted so that the tack after B-staging is at least 0 gf/5 mm$\phi$ and at most 5 gf/5 mm$\phi$, and the melt viscosity at 130° C. is at least 0.01 Pa·s and at most 1.0 Pa·s.

Encapsulation Resin Composition for Preapplication

In the present invention, "encapsulation resin composition for preapplication" shall refer to a resin composition used for the following purpose. That is, the encapsulation resin composition for preapplication is applied to a semiconductor wafer having solder bump electrodes formed on the circuit surface, dried, and B-staged to a certain degree at this time. The semiconductor wafer is then diced to singulate a semiconductor chip. The semiconductor chip is then positioned on a circuit board and heated to provisionally place, then thermally mounted.

The encapsulation resin composition for preapplication of the present invention generally comprises an epoxy resin and a curing agent having flux activity, and may optionally further comprise a solvent, a curing accelerator, an inorganic filler, a stress reducing agent, a reactivity diluent and other additive ingredients.

[Epoxy Resin (Ingredient (a))]

The epoxy resin used in the present invention may be any type that is used in the relevant field, among which those having at least two epoxy groups in each molecule are advantageous.

Specific examples of such epoxy resins include epoxy resins that are liquid at room temperature such as phenol novolac type epoxy resin, cresol novolac type epoxy resin, cresol naphthol type epoxy resin, biphenyl type epoxy resin, biphenylaralkyl type epoxy resin and naphthalene skeleton type epoxy resins, and epoxy resins that are liquid at room temperature such as bisphenol A diglycidyl ether type epoxy, bisphenol F diglycidyl ether type epoxy, bisphenol S diglycidyl ether type epoxy, o-allylbisphenol A type diglycidyl ether, 3,3',5,5'-tetramethyl-4,4'-dihydroxybiphenyldiglycidyl ether type epoxy, 4,4'-dihydroxybiphenyldiglycidyl ether type epoxy, 1,6-dihydroxybiphenyldiglycidyl ether type epoxy, phenol novolac type epoxy, brominated cresol novolac type epoxy, bisphenol D diglycidyl ether type epoxy, glycidyl ethers of 1,6-naphthalene diol and triglycidyl ethers of aminophenols. These may be used alone or as a combination of a plurality of types. Additionally, in order to obtain a reliable encapsulation resin composition, it is advantageous to have as few as possible ionic impurities such as Na$^+$, Cl$^-$ and the like of the epoxy resin.

As the epoxy resin used in the present invention, it is advantageous to use a condensed-ring aromatic compound or a biphenyl compound having at least two epoxy groups in the molecule. When an epoxy resin which is a condensed-ring aromatic compound or biphenyl compound is used, the Tg of the cured encapsulation resin composition is improved and a cured article excelling in heat resistance is obtained.

Additionally, the aforementioned condensed-ring aromatic compound or biphenyl compound advantageously has a molecular weight of 1000 or less, more advantageously of 500 or less. By making the molecular weight less than or equal to this upper limit value, it is possible to keep the melt viscosity at 130° C. adequately low, and to suppress the entrapment of voids when provisionally placing a semiconductor chip to which the encapsulation resin composition for preapplication has been applied on a circuit board.

By using an epoxy resin as described above, it is possible to obtain an encapsulation resin composition for preapplication wherein the tack after B-staging is at least 0 gf/5 mm$\phi$ and at most 5 gf/5 mm$\phi$, and the melt viscosity at 130° C. is at least 0.01 Pa·s and at most 1.0 Pa·s. The resulting encapsulation resin composition for preapplication also has a Tg after curing of at least 80° C., advantageously of at least 110° C. and at most 150° C. By making the Tg at least 110° C., the resistance to temperature cycling tests and resistance to reflow after thermocompression bonding is improved. Additionally, by making the Tg at most 150° C., the cured article after thermocompression bonding is not too hard, thus enabling warping of the semiconductor package to be reduced.

Specific examples of the epoxy resin shall be indicated below.

Examples of the condensed-ring aromatic compound having at least two epoxy groups in each molecule include compounds having a plurality of epoxy groups directly bound to a condensed-ring aromatic compound such as a naphthalene ring, an anthracene ring or a phenanthrene ring. Specific examples of such epoxy resins include cresol naphthol type epoxy resins, phenolnaphthol type epoxy resins, glycidyl ethers of naphthalene diol, naphthalene novolac type epoxy resins, anthracene type epoxy resins and phenanthrene type epoxy resins.

Specific examples of biphenyl compounds having at least two epoxy groups in each molecule include biphenol diglycidyl ether, 3,3',5,5'-tetramethyl 4,4'-dihydroxybiphenyldiglycidyl ether type epoxy, biphenyl novolac type epoxy and biphenylaralkyl type epoxy.

Among the above, glycidyl ethers of naphthalene diols having a molecular weight of 500 or less, naphthalene novolac type epoxy resins, anthracene type epoxy resins, biphenol diglycidyl ether type epoxy and 3,3',5,5'-tetramethyl 4,4'-dihydroxybiphenyl diglycidyl ether type epoxy are advantageous.

Additionally, as the epoxy resins used in the present invention, it is advantageous to use a combination of an epoxy resin that is liquid at 25° C. and an epoxy resin that is solid at 25° C.

In that case, the amount of the epoxy resin which is solid at room temperature is advantageously 50 wt % to 95 wt % with respect to the total amount of the epoxy resin which is liquid at room temperature and the epoxy resin which is solid at room temperature. At 50 wt % or more, the encapsulation resin more easily forms a film (becomes tack-free) during B-staging, and at 95 wt % or less, the crystallinity is reduced so that cracks and defects are less likely to occur in the encapsulation resin composition during dicing and handling.

Specific examples of epoxy resins that are liquid at 25° C. include bisphenol A diglycidyl ether type epoxy, bisphenol F diglycidyl ether type epoxy, bisphenol S diglycidyl ether type epoxy, o-allylbisphenol A type diglycidyl ether, 3,3',5,5'-tetramethyl 4,4'-dihydroxybiphenyldiglycidyl ether type epoxy, 4,4'-dihydroxybiphenyldiglycidyl ether type epoxy, 1,6-dihydroxybiphenyldiglycidyl ether type epoxy, phenol novolac type epoxy, brominated cresol novolac type epoxy, bisphenol D diglycidyl ether type epoxy, glycidyl ethers of 1,6-naphthalene diol, triglycidyl ethers of aminophenols, and monoepoxy compounds having a single epoxy group in the molecule.

Specific examples of epoxy resins that are solid at 25° C. include phenol novolac type epoxy resins, cresol novolac type epoxy resins, cresol naphthol type epoxy resins, biphenyl type epoxy resins, biphenylaralkyl type epoxy resins and naphthalene-skeleton type epoxy resins.

[Curing Agent Having Flux Activity (Ingredient (b))]

The "curing agent having flux activity" used in the present invention is a compound having functional groups reacting with the epoxy resin, and exhibiting a function of reducing the oxide layer on the surface of the solder electrodes provided on a semiconductor chip to such a degree as to allow electrical bonding to the substrate.

While general examples include carboxylic acids and acid anhydrides, compounds having at least two phenolic hydroxyl groups in each molecule and at least one carboxyl group directly bound to an aromatic in each molecule are advantageously used.

Specific examples include 2,3-dihydroxybenzoic acid, 2,4-dihydroxybenzoic acid, 2,5-dihydroxybenzoic acid (commonly known as gentisic acid), 2,6-dihydroxybenzoic acid, 3,4-dihydroxybenzoic acid, gallic acid, 1,4-dihydroxy-2-napthhoic acid, 3,5-dihydroxy-2-naphthoic acid, 3,7-dihydroxy-2-naphthoic acid, phenolphthalin and diphenolic acid. These compounds all absorb moisture well and can cause voids, and should therefore be dried beforehand in the process of fabrication.

The amount of the curing agent having flux activity used in the present invention is advantageously 10-70 wt %, more advantageously 30-60 wt % with respect to the epoxy resin. If the amount of the curing agent having flux activity added is at least as much as the lower limit, then the flux activity and the curability of the epoxy resin are adequately retained, and if less than or equal to the upper limit, then insufficiencies in curability due to reductions in out-gas and excessive curing agent can be prevented.

[Solvent (Ingredient (c))]

In the present invention, it is advantageous to use a solvent containing a solvent which has good solubility for the epoxy resin and poor solubility for the curing agent. By using such a solvent, it is possible to satisfactorily dissolve the epoxy resin while dispersing the curing agent having flux activity in the resin composition in solid form, thereby suppressing the curing reaction while the encapsulation resin composition is being applied to the semiconductor chip and B-staged, and stabilizing the melt properties such that the resin composition also melts when the semiconductor chip and board are being bonded, and enabling adequate flux activity to be achieved.

In the present invention, "good solubility" refers to the case in which, when 100 g of the epoxy resin are dissolved into 100 g of solvent, the undissolved portion of the epoxy resin is 10 g or less. Advantageously, the undissolved portion should be 1 g or less.

In the present invention, "poor solubility" refers to the case in which, when 10 g of the curing agent are dissolved into 100 g of the solvent, the undissolved portion of the curing agent is at least 8 g. Advantageously, the undissolved portion should be at least 9 g.

As for the method for testing the above-mentioned solubility, 100 g of solvent are poured into a glass beaker at room temperature, 100 g of the epoxy resin or 10 g of the curing agent are added thereto, the result is stirred for 1 hour using a magnetic stirrer, filtered using a filter sheet of known weight, the filtrand is dried for 3 hours at 80° C. and the residue weighed.

In the present invention, the solvent which has good solubility for the epoxy resin and poor solubility for the curing agent having flux activity may be changed according to the epoxy resin and curing agent having flux activity being used. In practice, it can be selected as appropriate by performing solubility tests with respect to the epoxy resin and curing agent having flux activity that are to be used.

Examples of the solvent that can be used in the present invention include publicly known solvents such as fatty alcohol solvents, ketone solvents, aldehyde solvents, carboxylic acid solvents, ester solvents, ether solvents, phenol solvents, hydrocarbon solvents, halogenated hydrocarbon solvents, acetal solvents, fatty acid solvents, acid anhydride solvents, nitrogen compound solvents, sulfur compound solvents and inorganic solvents.

In the present invention, it is advantageous to use an ether acetate solvent. Specific examples of ether acetate solvents include ethylene glycol monomethylether acetate, ethylene glycol monomethylether acrylate, ethylene glycol monoethylether acetate, ethylene glycol monoethylbenzoate, ethylene glycol monoethylisobutylate, ethylene glycol monoethylmethacrylate, ethylene glycol monobutylether acetate, ethylene glycol monoisobutylether benzoate, ethylene glycol monoisopropylether benzoate, ethylene glycol monophenylether acetate, ethylene glycol monophenylacrylate, 1,-acetoxy-2-ethoxyethane, 4-(2-acetoxyethoxy)toluene, 4'-(2-acetoxyethoxy) acetophenone, and propylene glycol-1-monomethylether-2-acetate. The boiling point should preferably be at least 150° C. in order to prevent excessive evaporation of the solvent during kneading or handling.

Furthermore, it is advantageous to use a solvent containing a first solvent and a second solvent in the present invention. In this case, the first solvent should have good solubility for epoxy resins and poor solubility for curing agents, and the second solvent should have a lower boiling point than the first solvent. Additionally, the boiling points of the first solvent and the second solvent should differ by at least 20° C., and the difference in boiling points should more advantageously be at least 30° C. If the difference in boiling point is at least as much as the lower limit, then the solvent evaporates more quickly, thus enabling reactions between the epoxy resin and curing agent to be suppressed during B-staging, and enabling the semiconductor chips to be more appropriately bonded to the substrate. In the present invention, it is also possible to add one or more solvents in addition to the first solvent and second solvent. Additionally, the second solvent may also be a solvent that has good solubility for the epoxy resin and poor solubility for the curing agent.

Even when used in conjunction with two or more solvents, the solvent may be a publicly known solvent such as a fatty alcohol solvent, a ketone solvent, an aldehyde solvent, a carboxylic acid solvent, an ester solvent, an ether solvent, a phenol solvent, a hydrocarbon solvent, a halogenated hydrocarbon solvent, an acetal solvent, a fatty acid solvent, an acid anhydride solvent, a nitrogen compound solvent, a sulfur compound solvent or an inorganic solvent, among which it is advantageous to use an ether acetate solvent.

More specifically, the first solvent in the present invention should preferably be an ether acetate solvent. Specific examples of ether acetate solvents include ethylene glycol monomethylether acetate, ethylene glycol monomethylether acrylate, ethylene glycol monoethylether acetate, ethylene glycol monoethylbenzoate, ethylene glycol monoethylisobutylate, ethylene glycol monoethylmethacrylate, ethylene glycol monobutylether acetate, ethylene glycol monoisobutylether benzoate, ethylene glycol monoisopropyl ether benzoate, ethylene glycol monophenyl ether acetate, ethylene glycol monophenyl acrylate, 1-acetoxy-2-ethoxyethane, 4-(2-acetoxy)toluene, 4'-(2-acetoxyethoxy)acetophenone and propylene glycol-1-monomethylether-2-acetate. The boiling point should be at least 150° C. in order to suppress excessive solvent evaporation during kneading or handling.

While the amount of the first solvent is not particularly restricted, it is advantageously 8-20 wt % with respect to the entire resin composition, for example, 10-18 wt %. If the amount is within the above range, then the composition is easier to work with when kneading the composition or supplying the composition.

While there are no restrictions on the second solvent, it should preferably be a solvent of the same type as the first solvent. Specifically, they should be combined such that if the first solvent is a fatty alcohol solvent, then the second solvent should also be a fatty alcohol solvent, and if the first solvent is an ether acetate solvent, then the second solvent should also be an ether acetate solvent. As a result, it is possible to improve the compatibility of the first solvent and the second solvent, thereby enabling the evaporation rates of these solvents to be controlled. By controlling the evaporation rate, it is possible to reduce the formation of voids in the resulting preapplied encapsulation resin.

While the boiling point of the second solvent should advantageously be lower than the boiling point of the first solvent as described above, the boiling point should preferably be at least 150° C.

An ether acetate solvent should preferably be used for (D) the second solvent of the present invention as well. Specific examples of ether acetate solvents include ethylene glycol monomethylether acetate, ethylene glycol monomethylether acrylate, ethylene glycol monoethylether acetate, ethylene glycol monoethylbenzoate, ethylene glycol monoethylisobutylate, ethylene glycol monoethylmethacrylate, ethylene glycol monobutylether acetate, ethylene glycol monoisobutylether benzoate, ethylene glycol monoisopropyl ether benzoate, ethylene glycol monophenyl ether acetate, ethylene glycol monophenyl acrylate, 1-acetoxy-2-ethoxyethane, 4-(2-acetoxy)toluene, 4'-(2-acetoxyethoxy)acetophenone and propylene glycol-1-monomethylether-2-acetate. The boiling point should be at least 150° C. in order to suppress excessive solvent evaporation during kneading or handling.

While the amount of the second solvent is not particularly restricted, it is advantageously 3-15 wt % with respect to the entire resin composition, for example, 5-10 wt %. If the amount is within the above range, then the composition has excellent potlife and shelflife.

While the amount of the first solvent and the amount of the second solvent are not particularly restricted, the amount of the first solvent should advantageously be greater. As a result, the composition has excellent potlife and shelflife.

An example of the amount of the solvent which may be added in the present invention is 10-70 wt % with respect to the epoxy resin for the total amount of the solvent.

While the amount also depends on the application process, it should be 15-35 wt % in the case of a printing format and 25-45 wt % in the case of a spin-coating format. If the amount of the ingredient added is at least as much as the lower limit, then the viscosity properties in the steady state, in particular the ease of working is improved, and if the amount is equal to or less than the upper limit, then the ease of handling (prevention of resin running) after application to the wafer is improved.

[Curing Acceralator]

If needed, a curing acceralator may be added to the encapsulation resin composition for preapplicaton of the present invention. While various types of curing acceralators may be used as long as they are generally used as curing acceralators for epoxy resins, specific examples include imidazoles, phosphorous compounds, diazo compounds and tertiary amines.

[Inorganic Filler]

If needed, an inorganic filler may be added to the present invention in order to adjust the curing properties. Specific examples include calcium carbonate, silica, alumina and aluminum nitride. While a plurality of types may be mixed together in accordance with the intended use, silica is particularly advantageous in terms of purity, reliability and cost. While there is no particular restriction on the amount added, it should advantageously be 80 wt % or less with respect to the epoxy resin in order to maintain the properties (such as moisture resistance and workability) as an encapsulation resin composition. It should more advantageously be 50 wt % or less. If less than or equal to the upper limit, then bonding can be performed well without any insulating fillers blocking the bonding between the bump electrodes of the semiconductor chip and the circuit board electrodes.

Additionally, the inorganic fillers used in the present invention should advantageously be spherical. This is because in the case of so-called crushed fillers, sharp surfaces can destroy circuits on the surface of the semiconductor chips. Additionally, the grain size of the inorganic filler should be 6 μm or less by average grain size, and 30 μm or less by maximum grain size. Within this range, the bond is not likely to be obstructed by fillers during solder bonding, thus reducing the possibility that connection defects will occur.

[Stress Reducing Agents]

If needed, a stress reducing agent can be added to the encapsulation resin composition for preapplication according to the present invention, and in particular, the melt viscosity can be reduced by adding a liquid stress reducing agent.

Here, the liquid stress reducing agent is a liquid substance capable of reducing stresses occurring during shaping of the epoxy resin composition or stresses occurring when heating or cooling the cured article, by being taken into the resin skeletal structure or dispersed in the resin to form a sea-island structure, and those generally used in encapsulating materials may be used. Examples include, but are not restricted to, liquid rubbers such as liquid butadiene rubber and silicone oils. These liquid stress reducing agents may have reactive functional groups, or functional groups or side chains increasing the compatibility with epoxy resins. Additionally, these liquid stress reducing agents may be used alone or as a mixture of two or more types.

Examples of silicone oils include siloxanes with dimethylsiloxane, diphenypolysiloxane and methylphenylpolysiloxane skeletal structures, which may have organic substituent groups such as methyl groups and phenyl groups, organic substituent groups having C, O, N or S atoms, or hydrophilic polymer chains such as alkylene oxides on the main or side chains in order to provide affinity with epoxy resins and phenol resins. Specific examples include, but are not restricted to, amino group-substituted organic groups, epoxy group-substituted organic groups, hydroxyl group-substituted organic groups, vinyl group-substituted organic groups, mercapto group-substituted organic groups, carboxyl group-substituted organic groups, phenethyl group-substituted organic groups, acryl group-substituted organic groups, alkoxy group-substituted organic groups, polyether group-substituted organic groups, caprolactone-substituted organic groups, ureido group-substituted organic groups and isocyanate group-substituted organic groups.

Examples of butadiene rubbers include butadiene alone or as random or block copolymers and graft copolymers with acrylonitrile or styrene, which may have organic substituent groups with C, O, N or S atoms and the like on the main or side chains in order to provide affinity to epoxy resins and phenol resins. Specific examples include, but are not restricted to, amino group-substituted organic groups, epoxy group-substituted organic groups, hydroxyl group-substituted organic groups, vinyl group-substituted organic groups, mercapto group-substituted organic groups, carboxyl group-substituted organic groups, phenethyl group-substituted organic groups, acryl group-substituted organic groups, alkoxy group-substituted organic groups, polyether group-substituted organic groups, caprolactone-substituted organic groups, ureido group-substituted organic groups and isocyanate group-substituted organic groups.

The amount of the above-described stress reducing agent should normally be 0.2-6 wt % with respect to the entire epoxy resin composition, advantageously 1-3 wt %. If the stress reducing agent is present at less than 0.2 wt %, then the low elasticities which are expected of cured epoxy resin compositions cannot be achieved, so the stress reduction can be insufficient and cause reductions in the shock resistance, and if present at more than 6 wt %, then the fluidity and moldability at the time of molding can be reduced, the resistance to solder cracks can be reduced, and there may be defects in the appearance of the resulting semiconductor device.

[Reactivity Diluent]

If needed, a reactivity diluent may be added to the encapsulation resin composition for preapplication of the present invention, and this can also reduce the melt viscosity. Here, "reactivity diluent" refers to a compound that lowers the viscosity of the resin composition, contains a functional group (e.g. epoxy group) that acts to cure the encapsulation resin composition, and has a function of reducing the viscosity of the encapsulation resin composition.

Examples of such reactivity diluents include, but are not restricted to, monoglycidyl ether compounds such as butylglycidyl ether, 2-ethylhexylglycidyl ether, trimethylol propane glycidyl ether, laurylglycidyl ether, allylglycidyl ether, phenylglycidyl ether, cresylglycidyl ether and butylphenylglycidyl ether, diglycidyl ether compounds such as ethylene glycol diglycidyl ether, glycerol diglycidyl ether, diethylene glycol diglycidyl ether, polyethylene glycol diglycidyl ether, polypropylene glycol diglycidyl ether, butane diol diglycidyl ether, 1,6-hexane diol diglycidyl ether and hydrogenated bisphenol A diglycidyl ether, glycidyl ester compounds such as glycidyl methacrylate and glycidyl versatate, alicyclic epoxy compounds such as vinylcyclohexene dioxide, aromatic epoxy compounds such as bisphenol F-type epoxy, and glycidyl aniline. These reactivity diluents may be used alone or as a mixture of two or more types. Additionally, the solvent and reactivity diluent can be mixed together for use. The amount of the reactivity diluent to be added should generally be 0.1-80 wt % with respect to the epoxy resin and advantageously 5-40 wt %. If the amount is less than 0.1 wt %, then there is a possibility that the effect of reducing the viscosity of the composition will not be achieved, and if the amount exceeds 80 wt %, then the adhesiveness to the substrate can be reduced.

[Other Additives]

The encapsulation resin composition for preapplication of the present invention may contain, in addition to the above-described epoxy resin, curing agent having flux activity, solvent, curing acceralator, inorganic filler, stress reducing agent, and reactivity diluent, further additives such as pigments, dyes, leveling agents, defoaming agents and coupling agents. However, since the above fillers and additives can cause reductions in the transparency of the encapsulation resin composition after B-staging, they should be of a type or amount in which the transparency is maintained after B-staging.

The encapsulation resin composition for preapplication of the present invention can be prepared by mixing together the various ingredients described above and degassing in a vacuum. Since the additives can all cause voids, they should be added after checking for their heat resistance, volatility and wettability to the substrate.

Next, the tack, melt viscosity and the Tg of the encapsulation resin composition for preapplication according to the present invention shall be explained.

[Tack]

"B-stage" refers to the state of the encapsulation resin composition for preapplication of the present invention, after application to a semiconductor wafer having solder bump electrodes formed on a circuit surface, and drying, at which time the reaction rate of the epoxy resin is 20-60%. If the reaction progresses too much, then there can be problems such as not remelting when heated or the flux activity not being achieved, which is not suitable for the present invention. The reaction rate of epoxy resin is calculated by the DSC heat capacity before and after reacting.

In the present invention, the tack after B-staging should be at least 0 gf/5 mmφ and at most 5 gf/5 mmφ. If the tack after B-staging is too high, then during the dicing step which follows application of the encapsulation resin composition to a wafer and B-staging, the tack of the resin composition can hamper the singulation of the wafers by the dicing plate, thus making the dicing process difficult or impossible. The tack after B-staging is advantageously at least 0 gf/5 mmφ and at most 3 gf/5 mmφ.

The aforementioned tack should be achieved at any one point within the range of reactivities for the epoxy resin of 20-60%. As long as it is achieved at one point within this range, then the work can proceed efficiently by B-staging in the vicinity of this point.

[Melt Viscosity]

In preapplied encapsulation, the semiconductor chip is generally often placed on the circuit board at a temperature of 130° C. Therefore, the melt viscosity of the present invention at 130° C. corresponds to the melt viscosity of the resin when provisionally placing the semiconductor chip to which the encapsulation resin composition for preapplication has been applied on a circuit board.

If the melt viscosity at 130° C. is at least 0.01 Pa·s, then the fluidity of the liquid material increases, thus being advantageous for suppressing voids and forming fillets, and a melt viscosity of 1.0 Pa·s or less is advantageous for reducing the entrapment of voids. The melt viscosity of the present invention at 130° C. is advantageously at least 0.1 Pa·s and at most 0.6 Pa·s. The method for measuring the melt viscosity may be by using a viscosity measuring device using a rotating cone, or a rheometry measuring device measuring the viscosity by applying a standard number of vibrations and torque.

[Tg]

In the present invention, it is advantageous for the Tg of the encapsulation resin composition for preapplication after curing to be at least 80° C. and at most 150° C. The expression "after curing" refers to the state after well-reacting the reactive ingredients in the encapsulation resin composition for preapplication, and for example, may refer to an epoxy resin reaction rate of 95% or more. Alternatively, the resin composition can be well-reacted by heating the resin composition to 150° C. for three hours.

While the Tg after curing can be made 80° C. or less by adding, for example, more than a certain amount of a monoepoxy compound to the epoxy resin as an ingredients of the encapsulation resin composition for preapplication, if the Tg after curing is too low, then this may cause the problem of the effects of bump protection not being achieved. Additionally, if the Tg is more than the upper limit value, then the cured article can become brittle and the fillet may crack.

While it has already been mentioned that the tack and melt viscosity of the present invention can be achieved by selecting an appropriate epoxy resin, they can further be achieved, for example, by appropriately combining the following methods.

(i) Method of Using a Liquid Epoxy Resin and a Low Molecular Weight Solid Epoxy Resin as the Epoxy Resins for the Encapsulation Resin Composition for Preapplication By using a liquid epoxy resin as the epoxy resin in the encapsulation resin composition for preapplication, the viscosity of the main ingredient is reduced, thus reducing the viscosity when melted. By further combining with a solid epoxy, the tack during the B-stage can be suppressed to achieve a low melt viscosity during provisional placement. The liquid epoxy resins and low molecular weight solid epoxy resins which are preferably used are described above.

(ii) Method of Reducing the Amount of Curing Agent in the Encapsulation Resin Composition for Preapplication or Using a Curing Agent with a Low Boiling Point.

The curing agent having flux activity used in the present invention is normally solid, and therefore acts to raise the melt viscosity at 130° C. By reducing the amount of this curing agent within such a level as not to detract from the properties of the liquid resin composition of the present invention, the solid part of the encapsulation resin composition for preapplication can be reduced, thus also reducing the viscosity when melted. Additionally, it is also effective to use a curing agent having a low melting point. The types and amounts of curing agents that are preferably used are as described above.

(iii) Method of Adding a Liquid Stress Reducing Agent to the Encapsulation Resin Composition for Preapplication By adding a liquid stress reducing agent to the encapsulation resin composition for preapplication, it is possible to reduce the viscosity of the main ingredient to thereby reduce the melt viscosity. The liquid stress reducing agents that are preferably used have been mentioned above.

(iv) Method of Mixing a Reactivity Diluent into the Encapsulation Resin Composition for Preapplication By adding a reactivity diluent to the encapsulation resin composition for preapplication, the viscosity of the encapsulation resin composition for preapplication overall can be reduced, thereby reducing the melt viscosity. The reactivity diluents that are preferably used have been mentioned above.

(v) Method of Selecting the Solvent for the Encapsulation Resin Composition for Preapplication A solvent that has good solubility for the epoxy resin and poor solubility for the curing agent having flux activity is used. By using such a solvent, when the encapsulation resin composition for preapplication of the present invention is applied to a semiconductor wafer and dried, the curing agent having flux activity disperses into the resin in solid form without dissolving into the epoxy resin, thus suppressing the curing reaction in the B-stage. As a result, the curing rate remains low until immediately before provisional placement, and a low melt viscosity is achieved during provisional placement. The solvents that are preferably used have been mentioned above.

Semiconductor Device

Next, the semiconductor device production method of the present invention shall be explained.

While examples of methods for applying the encapsulation resin composition for preapplication onto wafers include printing using metal masks and mesh masks, spin-coating, and methods of adhering sheets formed on release films, in the case of the present invention, printing methods and spin-coating methods are generally used.

As for the method for B-staging the encapsulation resin composition after application to the wafer, a drying step is usually required, and this can be performed by letting stand for a certain period of time in a drying oven, or replaced by an in-line oven or conveyor-type heating furnace. Step heating, steady heating or steady cooling can be set as needed.

The wafer can be singulated by performing dry or wet dicing using a common dicing machine.

As for the method of thermocompression bonding between the surface of the singulated semiconductor chip to which the resin composition has been applied and the substrate, there are generally methods of using a flip-chip bonder to position, then directly thermocompression bonding, and methods of positioning and provisional placement followed by thermal connection in a reflow furnace or the like. In that case, a thermal profile that is suited to semiconductor packages and encapsulating methods is used. Additionally, chip placement can be performed by a flip-chip bonder, or alternatively by a device such as a die bonder that allows for positioning.

Preapplied Encapsulated Components

The present invention also offers a preapplied encapsulated component characterized in that a curing agent having flux activity is dispersed as an undissolved part in an encapsulation resin composition. The curing agent having flux activity is present as a dispersion phase in a continuous phase formed by the epoxy resin. The particle size of the dispersion phase in this case is generally about a few microns. By using a preapplied encapsulated component having this kind of structure, it is possible to achieve the effect that the activity of the curing agent is for the most part achieved when bonding the semiconductor chip to the substrate. Not all of the curing agent having flux activity that has been added needs to be dispersed as an undissolved part, and some may be dissolved into the resin composition as long as the dissolved part is not enough to cause the curing reaction to occur excessively when B-staging. Specifically, the effects of the present invention can be achieved as long as at least 60 wt % of the curing agent having flux activity which has been added is dispersed as an undissolved part. The amount undissolved is more advantageously at least 80%.

EXAMPLES

The specific ingredients used in the present examples are as follows.

Bisphenol F-type epoxy resin: product of Dainippon Ink and Chemicals, EXA-830LVP (epoxy equivalent 161, molecular weight 340, liquid at 25° C.)
Bisphenol F-type epoxy resin: product of Dainippon Ink and Chemicals, EXA-830CRP (epoxy equivalent 161, molecular weight 340)
Diallybisphenol A-type epoxy resin: product of Nippon Kayaku, RE-810NM (epoxy equivalent 210, liquid at 25° C.)
Biphenyl-type epoxy resin: product of Nippon Kayaku, NC3000 (epoxy equivalent 272, average molecular weight 1000, solid at 25° C., softening point 58° C.)
Low-viscosity biphenyl-type epoxy resin: product of Nippon Kayaku, CER3000L (epoxy equivalent 237, average molecular weight 700)
Low molecular weight biphenyl-type epoxy resin: product of JER, YX-4000K (epoxy equivalent 185, molecular weight 360)
Naphthalene-type epoxy resin: product of Dainippon Ink and Chemicals, HP4032D (epoxy equivalent 140, molecular weight 272)
Monoepoxy resin: product of Nippon Kayaku, SBTH (t-butylphenylglycidyl ether) (epoxy equivalent 206, molecular weight 202)
Cresol naphthol-type epoxy resin: product of Nippon Kayaku, NC7300L (epoxy equivalent 212, average molecular weight 800, solid at 25° C., softening point 62° C.)
Gentisic acid: product of Midori Kagaku, 2,5-dihydroxybenzoic acid
Phenol novolac: product of Sumitomo Durez , PR-51470
Sebacic acid: product of Tokyo Chemical Industry
2P4MZ: product of Shikoku Chemicals, 2-phenyl-4-methylimidazole
Butadiene nitrile rubber: product of Ube Industries, CTBN1008SP (carboxyl-terminated butadiene acrylic rubber)
Solvent (BCSA): product of Tokyo Chemical Industry, ethylene glycol monobutyl ether acetate As for the solvent, those of reagent grade were used.

Examples 1-8, Comparative Examples 1-3

The ingredients were added as shown in Table 1, dispersed and kneaded in a three roll mill, and deaerated in a vacuum to obtain an encapsulation resin composition. Additionally, this encapsulation resin composition was used to perform the evaluation experiment indicated below. The results are shown in Table 1.

Furthermore, the encapsulation resin composition obtained as described above was used to fabricate the semiconductor device of the present invention in the following way.

Vacuum printing equipment by Toray Engineering was used in a two-step printing process with urethane squeegees. At this time, about 60 g of an encapsulation resin were supplied over a 100 μm thick metal mask and applied to a 6-inch wafer carrying semiconductor chips, without creating a vacuum. During this first step, the squeegee angle was set to 30° and the squeegee pressure was set to 0.4 Pa for the purpose of resin application. During the second step, the squeegee was set to an angle of 500 and the squeegee pressure was set to 0.1 Pa for the purpose of planarizing the applied material.

The encapsulation resin composition applied to a thickness of about 100 μm roughly the same as the thickness of the mask by means of the printing equipment was dried at 90° C. for 90 minutes in a pre-equilibriated drying oven, then the resin composition was B-staged.

Dicing equipment by Disco was used to perform wet dicing, and singulation into 10 mm square chips in the A-mode. At this time, ordinary wafer drying was not performed in order to prevent melting of the planarized resin composition and changes in the shape of the diced surfaces.

A flip-chip bonder by Shibuya Kogyo was used to provisionally place a chip for 15 seconds at 130° C. and a pressure of 5 kgf/chip, then heating for 5 seconds at 250° C. to melt the solder, to thereby perform flip-chip bonding and preapplied encapsulation. At this time, the pad portions on the substrate had openings in the solder resist (40 μm thick), to form cavities. The flip chips were post-cured at 150° C. for 90 minutes, then checked for their connection and occurrence of voids.

TABLE 1

| | General Name | Product Name | EX 1 | EX 2 | EX 3 | EX 4 | EX 5 | EX 6 |
|---|---|---|---|---|---|---|---|---|
| | | | | | | | (weight ratio) | |
| Epoxy resin | Bisphenol F epoxy | EXA-830LVP | 25 | | 20 | 25 | 25 | |
| | | EXA-830CRP | | 25 | | | | |
| | Biphenyl epoxy | NC-3000 | 50 | 75 | 75 | | 75 | 85 |
| | | CER3000L | 25 | | | 25 | | |
| | | YX-4000K | | | | | | |

TABLE 1-continued

|  |  |  |  |  |  |  |  |  |
|---|---|---|---|---|---|---|---|---|
|  | Naphthalene epoxy | HP4032D |  |  |  |  |  |  |
|  | Monoepoxy resin | SBTH |  |  |  | 5 |  | 10 |
|  | Cresol naphthol epoxy | NC-7300L |  |  |  |  | 50 |  |
| Curing agent w/ flux activity | Phenol compound with carboxyls | Gentisic acid | 30 | 30 | 30 | 30 | 20 | 30 |
| Curing agent w/o flux activity | Phenol novolac | PR-51470 |  |  |  |  |  |  |
| Curing acceralator | Imidazole | 2P4MZ | 0.2 | 0.2 | 0.2 | 0.2 | 0.2 | 0.2 |
| Solvent | Ether acetate | Ethylene glycol monobutyl ether acetate | 30 | 30 | 30 | 30 | 30 | 30 |
| Stress reducing agent | Butadiene nitrile rubber | CTBN1008SP | 1 | 1 | 1 | 1 | 1 | 1 |
| Evaluation result for resin composition | Melt viscosity at 130° C. (Pa · s) |  | 0.5 | 0.3 | 0.1 | 0.8 | 0.3 | 0.01 |
|  | Tack after B-staging (gf/5 mmφ) |  | A | A | A | A | A | A |
|  | Tg after curing (° C.) |  | 100 | 95 | 110 | 110 | 100 | 90 |
| Mounting evaluation results | Void-free rate (%) (defective samples/samples) |  | 100 (0/20) | 100 (0/20) | 100 (0/20) | 100 (0/20) | 100 (0/20) | 100 (0/20) |
|  | Reflow resistance test |  | Pass (0/5) | Pass (0/5) | Pass (0/5) | Pass (0/5) | Pass (0/5) | Pass (0/5) |

|  |  |  |  |  |  | (weight ratio) |  |
|---|---|---|---|---|---|---|---|
|  | General Name | Product Name | EX 7 | EX 8 | CE 1 | CE 2 | CE 3 |
| Epoxy resin | Bisphenol F epoxy | EXA-830LVP EXA-830CRP | 25 | 20 |  | 100 | 25 |
|  | Biphenyl epoxy | NC-3000 | 20 | 20 | 100 |  | 50 |
|  |  | CER3000L |  | 20 |  |  | 25 |
|  |  | YX-4000K | 15 |  |  |  |  |
|  | Naphthalene epoxy | HP4032D | 40 | 40 |  |  |  |
|  | Monoepoxy resin | SBTH |  |  |  |  |  |
|  | Cresol naphthol epoxy | NC-7300L |  |  |  |  |  |
| Curing agent w/ flux activity | Phenol compound with carboxyls | Gentisic acid | 30 | 30 | 30 | 30 |  |
| Curing agent w/o flux activity | Phenol novolac | PR-51470 |  |  |  |  | 50 |
| Curing acceralator | Imidazole | 2P4MZ | 0.2 | 0.2 | 0.2 | 0.2 | 0.2 |
| Solvent | Ether acetate | Ethylene glycol monobutyl ether acetate | 30 | 30 | 30 | 30 | 30 |
| Stress reducing agent | Butadiene nitrile rubber | CTBN1008SP | 1 | 1 | 1 | 1 | 1 |
| Evaluation result for resin composition | Melt viscosity at 130° C. (Pa · s) |  | 0.1 | 0.1 | 3.5 | — | 0.3 |
|  | Tack after B-staging (gf/5 mmφ) |  | A | A | A | C | A |
|  | Tg after curing (° C.) |  | 115 | 120 | 120 | 90 | 110 |
| Mounting evaluation results | Void-free rate (%) (defective samples/samples) |  | 100 (0/20) | 100 (0/20) | 10 (18/20) | — | 100 (0/20) |
|  | Reflow resistance test |  | Pass (0/5) | Pass (0/5) | Pass (0/5) | — | —* |

* Reflow test not performed

The various evaluation tests performed in Examples 1-8 and Comparative Examples 1-3 shall be explained below.

(1) Melt Viscosity at 130° C.

A liquid resin was spread to a thickness of 50 pm and an area of 10 mm×50 mm on a glass slide with a thickness of 1 mm, then B-staged at 90° C. for 90 minutes. 1 g of each sample was sliced away with a razor and collected, then their melt viscosities were measured at a heating rate of 15° C./min, a measurement gap of 200 μm and a cone size of 40 mmφ using a Haake rheometer. The viscosity at 130° C. was read from the resulting data.

(2) Tack After B-Staging

Samples prepared to the same size as (1) were surface-dried at 90° C. for 90 minutes, then evaluated using a probe tack method. The reference symbols are as described below.

Presence/Absence of Tack

The presence or absence of tack on the semiconductor adhesive films was evaluated using a probe tack method. The reference symbols are as described below.

A: No tack (at least 0 gf/5 mmφ and less than 5 gf/5 mmφ)
B: Some tack, unusable in practice (at least 5 gf/5 mmφ, less than 100 gf/5 mmφ)
C: Tack present (at least 100 gf/5 mmφ)

(3) Reaction Rate of Epoxy Resin

The heat capacities of both an encapsulation resin composition for preapplication with the epoxy resin unreacted and an encapsulation resin composition for preapplication after a reaction has progressed on the epoxy resin were measured using a DSC, the former being indicated by A and the latter being indicated by B. The reaction rate X for the epoxy resin in the present invention is computed by $X (\%)=(1-B/A)\times 100$.

The reaction rates of the epoxy resins in the B-stage for the samples prepared in the examples were all within the range of 20-80%.

(4) Tg After Curing

Samples prepared to the same size as (1) were provisionally dried at 90° C. for 90 minutes, then injected into molds with dimensions of 4 mm×4 mm×10 mm. These were post-cured at 150° C. for 90 minutes, then compressed using a TMA by SII, then scanned in the temperature range of −100° C. to 300° C. at a heating rate of 10° C./min, to determine Tg from the inflection point of the resulting curve.

(5) Void-Free Rate

After curing the resin compositions, 20 standard samples respectively were observed for voids and separation using a scanning acoustic tomograph (SAT), and samples in which such defects were observed were considered to be defective samples.

The void-free rate is the proportion of samples among the 20 in which defects were not observed.

(6) Reflow Resistance

Semiconductor packages with a connection rate of 100% were selected, subjected to 72 hours of moisture absorption at a temperature of 30° C. and humidity of 60%, then passed three times through a reflow with a temperature profile having a maximum temperature of 260° C., then evaluated for apparent cracks in the encapsulation resin and separation of boundary surfaces using a SAT (standard n=5). The semiconductor packages were held to be defective if separation was observed in any one location in terms of the state of separation of the boundary surfaces, and the magnitudes thereof were clearly recorded.

In Comparative Example 1, the combination of epoxy resins used is not capable of achieving 1.0 Pa·s at 130° C. when melted, and while it has good reliability such as in reflow resistance, it performs poorly in terms of the occurrence of voids (particularly entrapped voids), and a relatively large number of voids was observed.

Since Comparative Example 2 only uses liquid epoxy resins, the tack after B-staging became very high, so that the wafers were not able to be singulated by dicing and mounting evaluation tests could not be performed.

In Comparative Example 3, viscosity was achieved when melted and the occurrence of voids was improved, but a curing agent no having flux activity was used, so flip-chip connection was not possible, and a reliable semiconductor package was not able to be produced.

In contrast, the examples were confirmed to excel in their void properties and flux activity.

Example 9

A liquid encapsulation resin composition was obtained by measuring out 25 parts by weight of bisphenol F-type epoxy resin and 75 parts by weight of biphenyl-type epoxy resin as the epoxy resin, 30 parts by weight of gentisic acid (melting point 202° C.) vacuum-dried beforehand for 5 hours at 120° C. and 5 torr as the curing agent having flux activity, 22.5 parts by weight of ethylene glycol monobutyl ether acetate as the first solvent, 7.5 parts by weight of ethylene glycol monoethyl ether acetate as the second solvent, and 0.2 parts by weight of 2-phenyl-4-methylimidazole as the curing acceralator, dispersively kneading in a three roll mill, and deaerating in a vacuum. The below-described evaluation tests were performed using this resin composition. The results are shown in Table 2.

Examples 10-20

Experiments were performed in the same manner as Example 9, aside from the fact that the formulations were modified as described in Tables 2 and 3. The evaluation results are also shown in Tables 2 and 3.

Comparative Examples 4-5

Aside from the fact that the formulations were changed as shown in Table 3, experiments were performed in the same manner as Example 9. The evaluation results are also shown in Table 3.

TABLE 2

| | General Name | Product Name | EX 9 | EX 10 | EX 11 | EX 12 | EX 13 | EX 14 | EX 15 | EX 16 (weight ratio) |
|---|---|---|---|---|---|---|---|---|---|---|
| Epoxy resin | Bisphenol F epoxy | EXA-830LVP | 25 | 25 | 25 | 25 | 25 | 25 | 25 | 25 |
| | Biphenyl epoxy | NC-3000 | 75 | 75 | 75 | 75 | 75 | 75 | | |
| | Cresol naphthol epoxy | NC7300L | | | | | | | 75 | 75 |
| Curing agent | Phenol compound with carboxyls | Gentisic acid | 30 | 30 | 30 | 30 | 30 | 30 | 30 | 30 |
| | Normal curing agent (w/o flux activity) | Phenol novolac | | | | | | | | |
| Curing acceralator | Imidazole | 2P4MZ | 0.2 | 0.2 | 0.2 | 0.2 | 0.2 | 0.2 | 0.2 | 0.2 |
| Solvent | Ether acetate | Ethylene glycol monobutyl ether acetate | 22.5 | 22.5 | 22.5 | 22.5 | 27 | | 22.5 | |
| | | Ethylene glycol monoethyl ether acetate | 7.5 | | | | | | 7.5 | |
| | Alcohol | Diacetone alcohol | | 7.5 | | | | 22.5 | | |
| | Ester | Ethyl acetate | | | 7.5 | | | 7.5 | | 7.5 |
| | | γ-butyrolactone | | | | | | | | 22.5 |
| | Ketone | Methylethylketone | | | | 7.5 | | | | |
| | Hydrocarbon | Hexane | | | | | 3 | | | |
| Boiling point difference (° C.) | | | 36 | 24 | 115 | 112 | 123 | 91 | 36 | 127 |
| Stress reducing agent | Butadiene nitrile rubber | CTBN1008SP | 1 | 1 | 1 | 1 | 1 | 1 | 1 | 1 |
| Resin composition evaluation results | Melt viscosity at 130° C. (Pa · s) | | 0.4 | 0.7 | 0.5 | 0.5 | 0.4 | 0.6 | 0.8 | 0.5 |
| | Tack after B-staging (gf/5 mmφ) | | A | A | A | A | A | A | A | A |
| | Tack-free after B-staging | | Pass | Pass | Pass | Pass | Pass | Pass | Pass | Pass |
| | Gelling time after B-staging (sec) | | 210 | 240 | 190 | 210 | 200 | 210 | 230 | 240 |
| | Reaction rate after B-staging (%) | | 35 | 35 | 40 | 40 | 40 | 40 | 30 | 30 |
| | Pot life (hours) | | 72 | 72 | 48 | 24 | 12 | 48 | 72 | 72 |
| | Wet spreading rate (%) | | 64 | 62 | 60 | 58 | 58 | 60 | 63 | 62 |

TABLE 3

| | General Name | Product Name | EX 17 | EX 18 | EX 19 | EX 20 | CE 4 | CE 5 |
|---|---|---|---|---|---|---|---|---|
| | | | | | | | | (weight ratio) |
| Epoxy resin | Bisphenol F epoxy | EXA-830LVP | 25 | 25 | 25 | 25 | 25 | 25 |
| | Biphenyl epoxy | NC-3000 | 75 | 75 | 75 | 75 | 75 | 75 |
| | Cresol naphthol epoxy | NC7300L | | | | | | |
| Curing agent | Phenol compound with carboxyls | Gentisic acid | 30 | 30 | 30 | 30 | 30 | |
| | Normal curing agent (w/o flux activity) | Phenol novolac | | | | | | 60 |
| Curing acceralator | Imidazole | 2P4MZ | 0.2 | 0.2 | 0.2 | 0.2 | 0.2 | 0.2 |
| Solvent | Ether acetate | Ethylene glycol monobutyl ether acetate | | | | | | 22.5 |
| | | Ethylene glycol monoethyl ether acetate | | | | | | 7.5 |
| | Alcohol | Diacetone alcohol | 30 | | | | | |
| | Ester | Ethyl acetate | | 30 | | | | |
| | | γ-butyrolactone | | | | | | |
| | Ketone | Methylethylketone | | | 30 | 22.5 | | |
| | Hydrocarbon | Hexane | | | | 7.5 | 30 | |
| Boiling point difference (° C.) | | | | | | 11 | | 36 |
| Stress reducing agent | Butadiene nitrile rubber | CTBN1008SP | 1 | 1 | 1 | 1 | 1 | 1 |
| Resin composition evaluation results | Melt viscosity at 130° C. (Pa · s) | | 0.8 | 0.5 | 0.5 | 0.6 | not evaluable | 0.9 |
| | Tack after B-staging (gf/5 mmφ) | | A | A | A | A | not evaluable | A |
| | Tack-free after B-staging | | Pass | Pass | Pass | Pass | not evaluable | Pass |
| | Gelling time after B-staging | | 3'17" | 1'45" | 1'40" | 1'36" | not evaluable | 3'29" |
| | Reaction rate after B-staging (%) | | 45 | 55 | 50 | 50 | not evaluable | 30 |
| | Pot life (hours) | | 48 | 6 | 6 | 8 | not evaluable | 72 |
| | Wet spreading rate (%) | | 58 | 52 | 50 | 50 | not evaluable | 24 |

Additionally, the solvents used in the present examples are shown in Table 4.

TABLE 4

| | | | Solubility test results | | | |
|---|---|---|---|---|---|---|
| | | | | Epoxy resin | | Curing agent |
| Solvent type | Solvent name | Boiling point (° C.) | EXA-830LVP | NC-3000 | NC-7300L | Gentisic acid |
| Ether acetate | Ethylene glycol monobutyl ether acetate | 192 | good solvent | good solvent | good solvent | poor solvent |
| | Ethylene glycol monoethyl ether acetate | 156 | good solvent | good solvent | good solvent | poor solvent |
| Alcohol | Diacetone alcohol | 168 | good solvent | good solvent | good solvent | not poor solvent |
| Ester | Ethyl acetate | 77 | good solvent | good solvent | good solvent | poor solvent |
| | γ-butyrolactone | 204 | good solvent | good solvent | good solvent | not poor solvent |
| Ketone | Methylethylketone | 80 | good solvent | good solvent | good solvent | not poor solvent |
| Hydrocarbon | Hexane | 69 | not good solvent | not good solvent | not good solvent | poor solvent |

The evaluation tests performed in Examples 9-20 and Comparative Examples 4-5 shall be described below.
(1) Melt Viscosity at 130° C.
Measured using the same method as the evaluation tests performed in Examples 1-8 and Comparative Examples 1-3.
(2) Tack After B-Staging
Measured using the same method as the evaluation tests performed in Examples 1-8 and Comparative Examples 1-3.
(3) Tack-Free Rate After B-Staging
Liquid encapsulation resins were spread to a thickness of 50 μm and an area of 10 mm×50 mm on a 1 mm thick glass slide, then B-staged at 90° C. for 60 minutes. Bemcot wipers by Asahi Kasei Fibers were pressed onto the samples, and the results were evaluated as Fail if any of the Bemcot adhered to the resin surface, and Pass if none adhered. It can be understood that when B-staging is not complete under the above conditions, tack remains on the resin surface and the evaporation of the solvent is inadequate.
(4) Gelling Time After B-Staging
1 g of each B-staged sample obtained in (3) was sliced away with a razor and collected, then the liquid resin composition was stirred with a scroll about once a second over a 200° C. hot plate, and the time until the point at which the tack was lost was measured with a stopwatch as the gelling time. At this time, in those with a gelling time of 2 minutes or less, the reaction has progressed too far, so that there is a possibility of the storability after B-staging and the life properties (such as flux activity) with respect to the present format being greatly reduced, and the gelling time is therefore preferably at least 3 minutes.

(5) Reaction Rate After B-Staging

About 10 mg of the B-staged samples obtained in (3) were measured into an aluminum pan for a DSC, and these were measured at a heating rate of 10° C./min using a DSC by SII. The results for the liquid resin compositions before B-staging were measured beforehand, and the reaction rates were calculated using the ΔH of the DSC heat peaks. In this case, those with a reaction rate of at least 50% can be understood to be such that the reaction has progressed further than necessary during B-staging, so that there is a possibility of the storability after B-staging and the life properties (such as flux activity) with respect to the present format being greatly reduced, and the reaction rate is therefore preferably 40% or less.

(6) Pot Life

A liquid resin composition (in the form of a syringe) stored at 25° C. was measured for viscosity versus storage time at a measuring temperature of 25° C., using a Toki Sangyo E-type viscometer (cone rotation speed set to 2.5 rpm). The time until a 100% increase from the initial viscosity was considered to be the pot life. Since those with a pot life of 8 hours or less will cause problems relating to productivity such as increased viscosity in the course of processing over a single day, the pot life is preferably at least 12 hours.

(7) Solder Wet Spreading Rate

A suitable amount of the B-staged sample obtained in (3) was taken onto a Cu plate, a solder ball (Sn3.5Ag) of known radius was placed thereon, and a solder wet spreading rate test was performed in compliance with the ASTM-B-545 standard, to determine the solder wet spreading rate on a 250° C. hot plate in terms of the aspect ratio.

Upon performing a similar measurement of the aspect ratio of a commercial flux, the result was 62%, so for the comparative evaluation criteria, those with an aspect ratio of 50% or less were considered to have a low solder wet spreading rate for Cu, and to be such that the oxide layer removal of the solder is not efficiently performed.

The resin compositions of Examples 9-16 achieve viscosity when melted, thus improving the void properties. They also excel in flux activity, and excel in all evaluated properties such as solder wet spreading rate and pot life.

In Example 17, the solvent did not have poor solubility for the curing agent, so the curing agent dissolved into the curing agent during mixing of the liquid resin materials, so the reaction progressed relatively far, and the solder wet spreading rate after B-staging was slightly inferior. The trend was particularly marked in Example 19, so that the pot life was reduced. In Example 18, a solvent with poor solubility to the curing agent was used, but it was of only one type with a low boiling point, so evaporation progressed during work, and it was inferior in terms of the wet spreading rate and in particular the pot life. Additionally, in Example 20, two solvents with low boiling points were used, and the curing agent dissolved into the methylethylketone, so the reaction progressed easily and material evaporation progressed relatively quickly. However, even in these Examples 17-20, a desired viscosity was achieved when melted, thus improving the void properties and providing satisfactory flux activity.

In contrast, in Comparative Example 4, the epoxy resin did not dissolve into the solvent, so it was not able to be evaluated as a resin composition. Additionally, in Comparative Example 5, a curing agent not having flux activity was used, so solder wet spreading was not able to be achieved, and therefore the functions of the present invention were not able to be accomplished.

The semiconductor device of the present invention was produced using the same method as the method described for Examples 1-8 and Comparative Examples 1-3.

FIG. 1 shows a scanning electron microscope (SEM) photograph of a cross section of the resin composition obtained in Example 9 after application to a wafer and B-staging at 90° C. for 60 minutes. In the enlargement in FIG. 1, the portions appearing white correspond to the component of the curing agent having flux activity and the portions appearing black correspond to the epoxy component. It is apparent that the resin composition is not uniform, and the curing agent component is finely dispersed in the resin composition. FIG. 2 is a SEM photograph showing the resin composition obtained in Example 9 after application to a wafer, B-staging and curing at 150° C. for 90 minutes. It is apparent that during the curing process, the curing agent component dispersed in the resin composition has dissolved and mixed with the remaining resin composition, making it uniform. The SEM equipment used for these measurements was a JEOL JSM-6060LV, set to resolutions of 450 times and 4000 times.

Example 21

An encapsulation resin composition was obtained by measuring out 25 parts by weight of a diallylbisphenol A type epoxy resin as an epoxy resin which is liquid at 25° C., 75 parts by weight of a biphenyl type epoxy resin as an epoxy resin which is solid at 25° C., 30 parts by weight of gentisic acid (melting point 202° C.) vacuum-dried beforehand for 5 hours at 120° C. and 5 torr as a curing agent having flux activity, 20 parts by weight of ethylene glycol monobutyl ether acetate (boiling point 192° C.) and 10 parts by weight of ethylene glycol monoethyl ether acetate (boiling point 156° C.) as solvents, 0.2 parts by weight of 2-phenl-4-methylimidazole as a curing acceralator, and 1 part by weight of carboxyl-terminated butadiene nitrile rubber as a stress reducing material, dispersively kneading in a three roll mill, and deaerating in a vacuum A semiconductor device of the present invention was produced by the method described in the above example, and the evaluation shown in Table 5 was performed on the resulting semiconductor device.

The details regarding the chip used in the present examples are provided below. A BT (connection pads: metal-plated surface) substrate was used as the substrate. Solder: tin-silver (melting point: 221° C.), number of bumps: 1936 (484 bumps/block), bump height: 80 μm, chip size: 10 mm square, passivation: polyimide, chip thickness: 525 μm.

Examples 22-23, Comparative Examples 6-8

Experiments were performed in the same manner as in Example 21, except that the formulations were changed as shown in Table 5. The evaluation results are also shown in Table 5.

TABLE 5

|  | General Name | Product Name | EX 21 | EX 22 | EX 23 | CE 6 | (weight ratio) CE 7 | CE 8 |
|---|---|---|---|---|---|---|---|---|
| Epoxy resin liquid at 25° C. | Bisphenol F epoxy | EXA-830LVP |  | 25 | 25 |  | 25 | 25 |
|  | Diallylbisphenol A epoxy | RE-810NM | 25 |  |  |  |  |  |
| Epoxy resin solid at 25° C. | Biphenyl epoxy | NC-3000 | 75 | 75 |  |  | 75 |  |
|  | Cresol naphthol epoxy | NC-7300L |  |  | 75 | 100 |  | 75 |
| Curing agent | Phenol compound with carboxyls | Gentisic acid | 30 | 30 | 30 | 30 |  |  |
|  | Phenol curing agent | Phenol novolac |  |  |  |  | 60 | 60 |
| Curing accelarator | Imidazole | 2P4MZ | 0.2 | 0.2 | 0.2 | 0.2 | 0.2 | 0.2 |
| Solvent | Ether acetate | Ethylene glycol monobutyl ether acetate | 20 |  |  | 30 | 30 | 30 |
|  |  | Ethylene glycol monoethyl ether acetate | 10 |  |  |  |  |  |
|  | Alcohol | Diacetone alcohol |  |  |  |  |  |  |
|  | Ester | γ-butyrolactone |  | 30 | 30 |  |  |  |
| Stress reducing agent | Butadiene nitrile rubber | CTBN1008SP | 1 | 1 | 1 | 1 | 1 | 1 |
| Resin composition evaluation results | Melt viscosity at 130° C. (Pa·s) |  | 0.5 | 0.4 | 0.7 | 4.0 | 0.7 | 0.9 |
|  | Tack after B-staging (gf/5 mmφ) |  | A | A | A | A | A | A |
|  | Tack-free after B-staging |  | Pass | Pass | Pass | Pass | Pass | Pass |
|  | Pot life (hours) |  | 72 | 6 | 6 | 24 | 72 | 72 |
|  | Wet spreading rate after B-staging (%) |  | 62 | 63 | 62 | 63 | — | — |
| Mounting evaluation results | Chipping rate when dicing |  | Good | Good | Good | Poor | Good | Good |
|  | Solder bump connection rate (%) |  | 100 (0/20) | 100 (0/20) | 100 (0/20) | 100 (0/20) | — | — |
|  | Void property |  | Pass (0/5) | Pass (0/5) | Pass (0/5) | Pass (0/5) | — | — |
| Semiconductor device evaluation results | Moisture absorption reflow test (separation resistance evaluation) |  | Pass (0/5) | Pass (0/5) | Pass (0/5) | Pass (0/5) | — | — |
|  | Temperature cycling test (separation resistance evaluation) |  | Pass (0/5) | Pass (0/5) | Pass (0/5) | Pass (0/5) | — | — |

The solvents used in the present examples are shown in Table 6.

TABLE 6

|  |  |  | Solubility test results | | | | |
|---|---|---|---|---|---|---|---|
|  |  | Boil | Epoxy resin | | | | Curing agent |
| Solvent type | Solvent name | point (° C.) | EXA-830LVP | RE-810NM | NC-3000 | NC-7300L | Gentisic acid |
| Ether acetate | Ethylene glycol monobutyl ether acetate | 192 | good solvent | good solvent | good solvent | good solvent | poor solvent |
|  | Ethylene glycol monoethyl ether acetate | 156 | good solvent | good solvent | good solvent | good solvent | poor solvent |
| Alcohol | Diacetone alcohol | 168 | good solvent | good solvent | good solvent | good solvent | not poor solvent |
| Ester | γ-butyrolactone | 204 | good solvent | good solvent | good solvent | good solvent | not poor solvent |

The evaluation tests performed in the present examples shall be explained below.

(1) Melt Viscosity at 130° C.

Measured using the same method as the evaluation tests performed in Examples 1-8 and Comparative Examples 1-3.

(2) Tack After B-Staging

Also measured using the same method as the evaluation tests performed in Examples 1-8 and Comparative Examples 1-3.

(3) Tack-Free Rate

Performed by the same methods as Examples 9-20 and Comparative Examples 4-5 aside from the fact that B-staging was performed at 90° C. for 90 minutes.

(4) Pot Life

Prepared epoxy resin compositions were divided into 1 cc syringes, stored in a 25° C. isothermic tank, and the viscosities at 25° C. and 2.5 rpm were measured using a Brookfield-type viscometer over the passage of time, and the time at which the viscosity increased by 30% over the initial value was recorded.

(5) Solder Wet Spreading Rate

Performed by the same methods as Examples 9-20 and Comparative Examples 4-5.

(6) Chipping Rate When Dicing

The epoxy resin compositions were applied to a thickness of 100 μm onto 6 inch wafers provided with solder electrodes, then dried and B-staged. The wafers were then singulated into 10 $mm^2$ chips using Disco dicing blades, during which time the state of chipping of the resin portions of the chips were observed, and those chipped even a little bit were evaluated as "Poor".

(7) Solder Bump Connection Rate

Standard amounts of the epoxy resin compositions were applied to 10 $mm^2$ chips with solder electrodes, B-staged at 90° C. for 90 minutes, then positioned using a flip chip bonder from above for installation on a substrate having designed thereon a flip chip of the same arrangement. At this time, the stage of the flip chip bonder was heated to about 60° C. Next, solder melting and connection was performed. The connection rate was checked in four block units connected in a daisy chain. That is, signals will not be passed if there is a connection flaw in any block, so the connection rate was counted as the number of defective blocks/total number of blocks (=4× 5).

(8) Void, Initial Separation Observation

After curing the resin compositions, they were observed for voids and separation using a scanning acoustic tomograph (SAT). The semiconductor packages were held to be defective if separation was observed in any one location in terms of the state of separation of the boundary surfaces (standard n=5), and the magnitudes thereof were clearly recorded.

(9) Reflow Resistance

Semiconductor packages with a connection rate of 100% were selected, subjected to 72 hours of moisture absorption at a temperature of 30° C. and 60%, then passed three times through a reflow with a temperature profile having a maximum temperature of 260° C., then evaluated for apparent cracks in the encapsulation resin and separation of boundary surfaces using a SAT (standard n=5). The semiconductor packages were held to be defective if separation was observed in any one location in terms of the state of separation of the boundary surfaces, and the magnitudes thereof were clearly recorded.

(10) Temperature Cycling (T/C)

The semiconductor packages subjected to the reflow resistance tests were subsequently subjected to T/C tests at −55° C. for 30 minutes and −125° C. for 30 minutes (standard n=5).

The state of cracking and separation was observed every 250 hours up to a maximum of 1000 hours. The semiconductor packages were held to be defective if separation was observed in any one location in terms of the state of separation of the boundary surfaces, and the magnitudes thereof were clearly recorded.

Since only a solid epoxy was used in Comparative Example 6, it had considerable brittleness after B-staging, and problems in the chipping rate when dicing.

Since the curing agents in Comparative Examples 7 and 8 did not have any flux properties, flip chip connection was not possible, and they were not able to accomplish the functions of the present invention.

On the other hand, while Examples 22-23 had somewhat inferior pot life, Examples 21-23 achieved viscosity when melted, thus improving the void properties, excelled in flux activity, excelled in chipping rate when dicing, and the fabricated semiconductor devices had excellent separation resistance.

The invention claimed is:

1. An encapsulation resin composition for preapplication, comprising (a) an epoxy resin, and (b) a curing agent having flux activity, wherein the tack after B-staging is at least 0 gf/5 mmφ and at most 5 gf/5 mmφ, and the melt viscosity at 130° C. is at least 0.01 Pa·s and at most 1.0 Pa·s.

2. An encapsulation resin composition for preapplication in accordance with claim 1, wherein the Tg after curing is at least 80° C. and at most 150° C.

3. An encapsulation resin composition for preapplication in accordance with claim 1, further comprising (c) a solvent containing a first solvent that has good solubility for said epoxy resin and poor solubility for said curing agent.

4. An encapsulation resin composition for preapplication in accordance with claim 3, wherein said solvent is added in an amount of 10-70 wt % with respect to said epoxy resin.

5. An encapsulation resin composition for preapplication in accordance with claim 3, wherein said first solvent is an ether acetate type solvent.

6. An encapsulation resin composition for preapplication in accordance with claim 3, wherein said solvent contains only said first solvent as a solvent.

7. An encapsulation resin composition for preapplication in accordance with claim 3, wherein said solvent further contains a second solvent having a lower boiling point than said first solvent.

8. An encapsulation resin composition for preapplication in accordance with claim 7, wherein the difference between the boiling points of said first solvent and said second solvent is at least 20° C.

9. An encapsulation resin composition for preapplication in accordance with claim 7, wherein said second solvent has good solubility for said epoxy resin and poor solubility for said curing agent.

10. An encapsulation resin composition for preapplication in accordance with claim 9, wherein said second solvent is an ether acetate type solvent.

11. An encapsulation resin composition for preapplication in accordance with claim 1, wherein said epoxy resin contains a condensed-ring aromatic compound having at least two epoxy groups in each molecule.

12. An encapsulation resin composition for preapplication in accordance with claim 11, wherein said condensed-ring aromatic compound has a molecular weight of 1000 or less.

13. An encapsulation resin composition for preapplication in accordance with claim 11, wherein said condensed-ring aromatic compound is a naphthalene compound.

14. An encapsulation resin composition for preapplication in accordance with claim 1, wherein said epoxy resin contains a biphenyl compound having at least two epoxy groups in each molecule.

15. An encapsulation resin composition for preapplication in accordance with claim 14, wherein said biphenyl compound has a molecular weight of 1000 or less.

16. An encapsulation resin composition for preapplication in accordance with claim 1, wherein said epoxy resin contains an epoxy resin that is liquid at 25° C. and an epoxy resin that is solid at 25° C.

17. An encapsulation resin composition for preapplication in accordance with claim 16, wherein the proportion of said solid epoxy resin with respect to the total weight of said liquid epoxy resin and said solid epoxy resin is 0.5-0.95.

18. An encapsulation resin composition for preapplication in accordance with claim 1, wherein said curing agent is a curing agent having at least two phenolic hydroxyl groups in each molecule and at least one carboxyl group directly bound to an aromatic in each molecule.

19. An encapsulation resin composition for preapplication in accordance with claim 18, wherein said curing agent is added in an amount of 10-70 wt % with respect to said epoxy resin.

20. A preapplied encapsulated component comprising a wafer and an encapsulation resin composition applied to a bonding surface of said wafer with a substrate, wherein said encapsulation resin composition is an encapsulation resin composition for preapplication in accordance with claim 1.

21. A preapplied encapsulated component in accordance with claim 20, wherein a curing agent with flux activity is dispersed as an undissolved part within the encapsulation resin composition for preapplication.

22. A semiconductor device encapsulated by an encapsulation resin composition for preapplication in accordance with claim 1.

23. A semiconductor device fabricated by steps of applying an encapsulation resin composition for preapplication in accordance with claim 1 onto a wafer, B-staging said encapsulation resin composition for preapplication after application onto said wafer, dicing said wafer to singulate semiconductor chips, and thermocompression bonding a substrate and a surface of a singulated semiconductor chip to which the encapsulation resin composition for preapplication has been applied.

24. A process for fabricating a semiconductor device comprising steps of applying an encapsulation resin composition for preapplication in accordance with claim 1 onto a wafer, B-staging said encapsulation resin composition for preapplication after application onto said wafer, dicing said wafer to singulate semiconductor chips, and thermocompression bonding a substrate and a surface of a singulated semiconductor chip to which the encapsulation resin composition for preapplication has been applied.

25. An encapsulation resin composition for preapplication comprising (a) an epoxy resin, (b) a curing agent having flux activity, (c) a first solvent, and (d) a second solvent, wherein said first solvent has good solubility for said epoxy resin and poor solubility for said curing agent, and said second solvent has a lower boiling point than said first solvent.

* * * * *